United States Patent [19]

Hamada

[11] Patent Number: 5,477,134
[45] Date of Patent: Dec. 19, 1995

[54] VOLTAGE SENSOR FOR USE IN OPTICAL POWER TRANSFORMER INCLUDING A PAIR OF POCKELS CELLS

[75] Inventor: Hidenobu Hamada, Amagasaki, Japan

[73] Assignee: Matsushita Electric Industrial Co., Ltd., Osaka, Japan

[21] Appl. No.: 152,234

[22] Filed: Nov. 16, 1993

[30] Foreign Application Priority Data

Nov. 20, 1992 [JP] Japan .................................. 4-312203

[51] Int. Cl.$^6$ .............................................. G01R 31/00
[52] U.S. Cl. ........................................ 324/96; 324/117 R
[58] Field of Search .................................. 324/96, 158.1, 324/73.1, 750, 765, 117 R; 250/231.1, 227.21; 356/365; 359/257

[56] References Cited

U.S. PATENT DOCUMENTS

| | | | |
|---|---|---|---|
| 3,584,949 | 6/1971 | Del Carlo et al. | 250/231 |
| 4,629,323 | 12/1986 | Matsumoto | 324/96 |
| 5,111,135 | 5/1992 | Kozuka et al. | 324/96 |
| 5,134,361 | 7/1992 | Pillow | 324/96 |
| 5,153,427 | 10/1992 | Takahashi et al. | 324/96 |

FOREIGN PATENT DOCUMENTS

| | | |
|---|---|---|
| 56-47723 | 4/1981 | Japan . |
| 59-90061 | 5/1984 | Japan . |
| 62-150170 | 7/1987 | Japan . |

OTHER PUBLICATIONS

IEEE Transaction on Power Delivery, vol. 5, No. 2, Apr. 1990, pp. 884–891, "Development of Optical Instrument Transformers", T. Sawa et al.

Proceed IEE, vol. 125, No. 10, Oct. 1978, pp. 935–941, "Noise Reduction in Optical Measurement Systems", A. M. Smith.

*Primary Examiner*—Vinh P. Nguyen
*Attorney, Agent, or Firm*—Wenderoth, Lind & Ponack

[57] ABSTRACT

A voltage sensor is composed by arranging along the optic axis, successively from the side of incident light, a first polarizer, a Pockels cell for detection, a Pockels cell for modulation, and a second polarizer wherein an electric field proportional to a voltage to be measured is applied to the Pockels cell for detection, and a periodic electric field for modulation that varies the phase difference by $2n\pi$ radians, where n is a positive integer, during each period and that has a frequency higher than the electric field applied to the Pockels cell for detection is applied to the Pockels cell for modulation, and the voltage to be measured is determined based on a phase change in the intensity of the light output from the second polarizer.

12 Claims, 6 Drawing Sheets

VOLTAGE SENSOR FOR USE IN OPTICAL POWER TRANSFORMER INCLUDING A PAIR OF POCKELS CELLS

BACKGROUND OF THE INVENTION

1. Field of the Invention

The present invention relates to a voltage sensor that is used in an optical PT (Power Transformer) that detects a voltage to ground or a voltage of a driving power source for motors and the like.

2. Description of the Related Art

An intensity-modulated voltage sensor is arranged to include, for example, as shown in FIG. 10, along the optical axis, successively from the side of incident light, a first polarizer 35 of set angle 90 degrees, a ¼ wavelength plate 38, a Pockels cell 2, and a second polarizer 36 of set angle 95 degrees, and a voltage to be measured is applied to Pockels cell 2. Since a change in the output intensity of second polarizer corresponds to the polarization state of the output light of Pockels cell 2, which varies depending on the voltage to be measured, the voltage to be measured can be determined by monitoring the change in the output power of the polarizer with an optical receiver. Here, the modulation depth of an output power is defined as the ratio of the AC component of the output power to the DC component of the output power.

However, a change in the loss of connection in each optical part and a change in the intensity of the incident light due to the external environment generate a gradual change in the output power apart from the above modulation of the output power due to the voltage to be measured. In particular, if the frequency of the voltage to be measured is near DC, it becomes impossible to distinguish the AC component of the voltage to be measured from the AC component due to the above secondary causes, so that an exact measurement can not be achieved.

SUMMARY OF THE INVENTION

The object of the present invention is therefore to solve the problem described above in a prior intensity-modulated voltage sensor and to provide a voltage sensor that performs the measurement from DC to high-frequency AC with its simple composition and without being influenced by the external environment.

In order to achieve the aforementioned objective the present invention provides a voltage sensor composed by arranging along an optical axis, successively from the side of incident light, a first polarizer, a Pockels cell for detection, a Pockels cell for modulation, and a second polarizer. An electric field proportional to the voltage to be measured is applied to the Pockels cell for detection. A periodic electric field for modulation that varies the difference of phase angles by 2 nπ radians, where n is a positive integer, during each period and that has a frequency higher than the electric field applied to the Pockels cell for detection is applied to the Pockels cell for modulation. The voltage sensor then detects the voltage to be measured from a phase change in the intensity of the light having passed through the second polarizer.

By using the voltage sensor, the voltage to be measured is determined for a wide range from DC to high frequency without being influenced by the external environment.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

The preferred embodiments according to the present invention will be described below with reference to the attached drawings.

Figure 1:
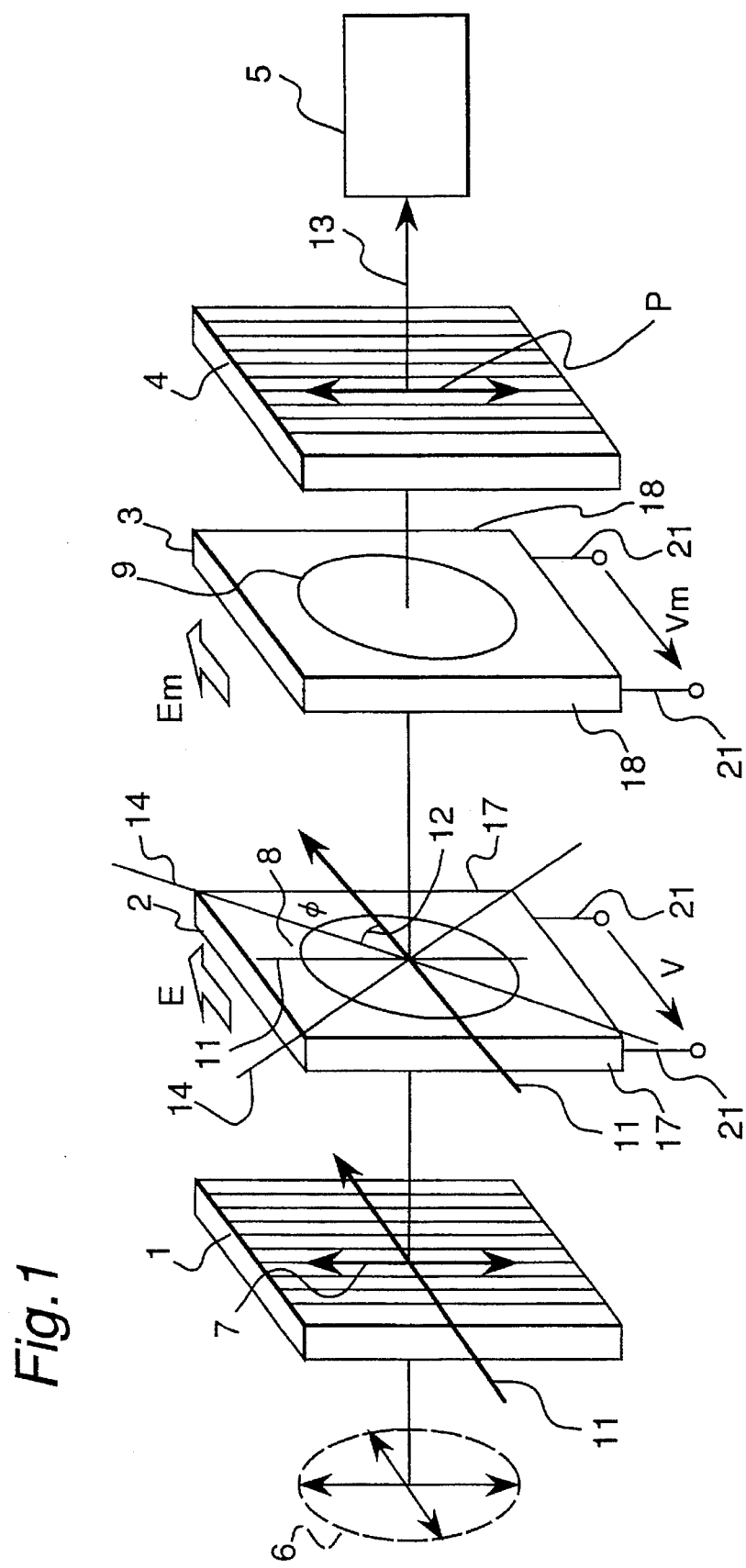
FIG. 1 is a diagram of an output-power phase-modulated voltage sensor of a first embodiment in accordance with the present invention.

FIG. 1 is a diagram of a voltage sensor of a first embodiment of the present invention, and FIGS. 2, 3, 4 and 5 show a block diagram of the first embodiment, and the graphs of changes in the voltages V and $V_m$ applied to Pockels cells and an output power P from the second polarizer. The voltage sensor comprises a first polarizer 1 of set angle 90 degrees, a Pockels cell 2 for detection whose set angle φ of the major axis 14 to a horizontal axis 11 thereof is 45 degrees, a Pockels cell 3 for modulation whose major axis is parallel to that of Pockels cell 2 for detection, and a second polarizer 4 of set angle 90 degrees successively arranged in this order from the side of incident light along an optical axis 14. Pockels cell 2 for detection and Pockels cell 3 for modulation are respectively provided with an electrodes couple 17 for applying a voltage to be detected and an electrodes couple 18 for applying a periodic voltage for modulation so that a parallel electric field in the direction of zero degrees is generated; a terminal 21 for applying voltage is attached to each electrode. Furthermore, an electric field E for detection, which is proportional to the voltage to be measured (voltage to be detected) is applied to the Pockels cell 2 for detection. A periodic electric field $E_m$ for modulation that varies the difference of phase angles by 2nπ radians, where n is a positive integer, during each period and that has a much higher frequency than that of magnetic field E applied to Pockels cell 2 for detection is applied to Pockels cell 3 for modulation with a periodic voltage $V_m$ for modulation. Here an example of Pockels cell 2 for detection and Pockels cell 3 for modulation is made of $LiNbO_3$.

Next, the theory is described. Unpolarized incident light 6 is changed by first polarizer 1 into linearly polarized light 7, which after passing through Pockels cell 2 for detection becomes elliptically polarized light 8 owing to phase angle θ of Pockels cell 2 for detection and, after passing through Pockels cell 3 for modulation, becomes elliptically polarized light 9, which corresponds to the sum θ+θ$_m$ of the difference of phase angles θ due to Pockels cell 2 for detection and the difference of phase angles θ$_m$ due to Pockels cell 3 for modulation. Further, the intensity of linearly polarized light 10, which results from passing through second polarizer 4 shows a change in the intensity proportional to {cos(θ$_m$+θ)+1}÷2 from the intensity of the incident light. Then a signal analyzer 5 for optical calculation compares the phase change θ+θ$_m$ of above output 10 with the phase difference θ$_m$ of the Pockels cell 3 for modulation to calculate the phase difference θ due to Pockels cell 2 for detection, and determines the voltage to be measured. Here the set angle of each device is an angle with respect to a base angle as indicated by a reference number 11 in FIG. 1, and the angle is measured in units of radians.

Figure 2:
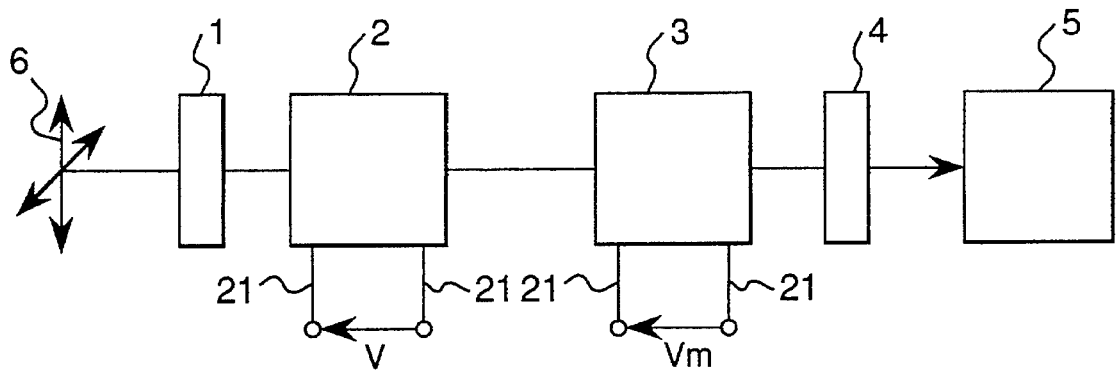
FIG. 2 is a block diagram of the phase-modulated voltage sensor according to the first embodiment of the present invention and FIGS. 2A and 2B are modifications thereof.
Figure 3:
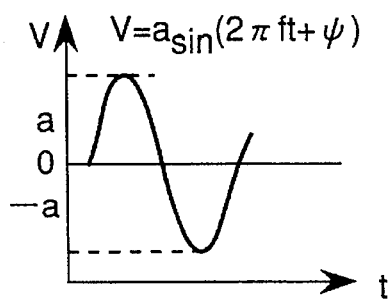
FIGS. 3, 4 and 5 are graphs showing waveforms of voltages V and $V_m$ and output P, respectively.
Figure 4:
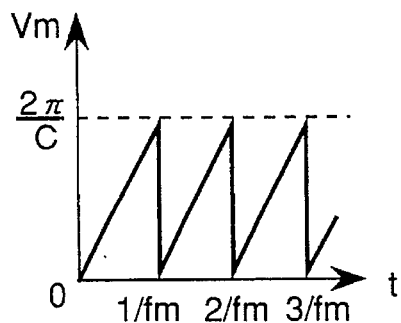
Figure 5:
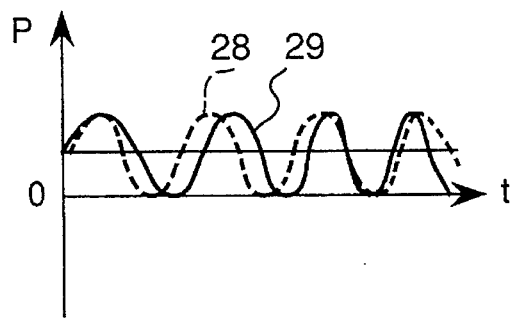

Next, the operation of the first embodiment is described with reference to FIGS. 2, 3 and 4. FIG. 2 shows a block diagram of the first embodiment. In Pockels cell 2 for detection, an electric field E for detection is generated by electrodes couple 17 for detection to which voltage to be measured V is applied. In Pockels cell 3 for modulation, an electric field E$_m$ for modulation is generated by electrodes couple 18 to which periodic voltage V$_m$ for modulation is applied. Suppose that voltage V to be measured has a sine waveform of amplitude a, frequency f, and initial phase angle φ, as shown in FIG. 3. Voltage V$_m$ for modulation has a sawtooth waveform of modulation frequency f$_m$ and varies linearly with slope 2π×f$_m$/C during each period of 1/f$_m$, as shown in FIG. 4. Here constant C is the proportional coefficient between a voltage for modulation and the phase difference of the Pockels cell 3 for modulation. With the application of voltage V to be measured, output P of polarizer 4 changes from the sine wave corresponding to the phase difference θ$_m$ of the Pockels cell 3 for modulation, which is proportional to voltage V$_m$ for modulation, as indicated by a dotted line 28 in FIG. 5, by the phase difference θ, which is due to the Pockels cell 2 for detection and proportional to voltage V to be measured, as indicated by a solid line 29 in FIG. 5. In other words, the waveform of output P of polarizer 4 is changed from the dotted line 28 to the solid line 29 when the voltage V to be detected is applied to Pockels cell 2 for detection. Then signal analyzer 5 for optical calculation demodulates voltage to be measured V proportional to the phase difference θ due to Pockels cell 2 for detection from the phase change θ+θ$_m$ of output 10. More concretely, the signal analyzer 5 is comprised of a photo-electric converter 5A for converting the output 10 of the second polarizer 4 into a voltage proportional thereto, a demodulator 5B for demodulating an output of the converter 5A and an integrator 5C for integrating an output of the demodulator 5B.

Here, modulation frequency f$_m$ is required to be sufficiently higher than the frequency f of voltage V to be measured. If voltage V to be measured is of commercial frequency, modulation frequency f$_m$ of about 1 kHz is sufficient.

Figure 2A:
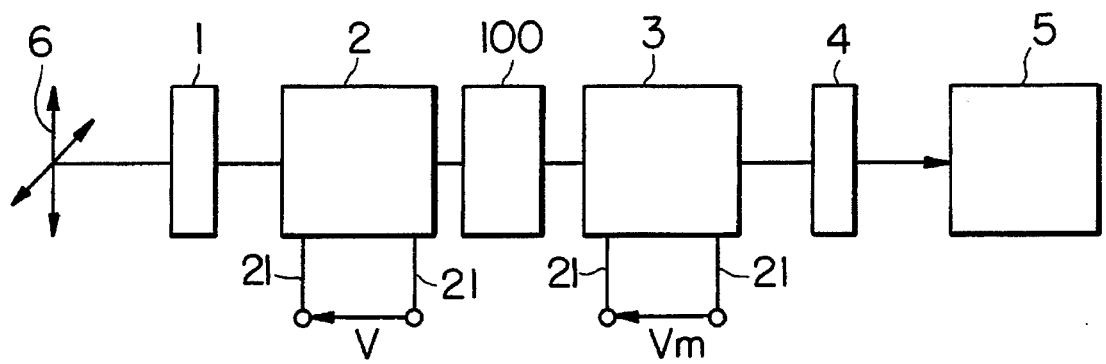
Figure 2B:
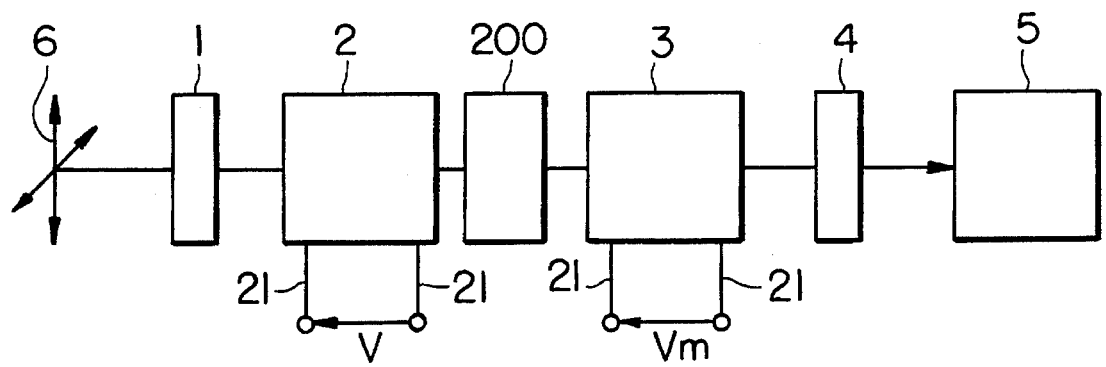

FIG. 2A and 2B are block diagrams of modifications of the embodiment of FIG. 2.

In FIG. 2A one quarter wavelength plate 100 is shown between elements 2 and 3 but may be disposed between elements 1 and 2 or 3 and 4. The wavelength of the one quarter wavelength plate is that of the frequency of the voltage to be measured.

In FIG. 2B, an optical transmission channel 200 for preserving the polarization state of the light passing therethrough is substituted for the quarter wavelength plate 100.

Figure 6:
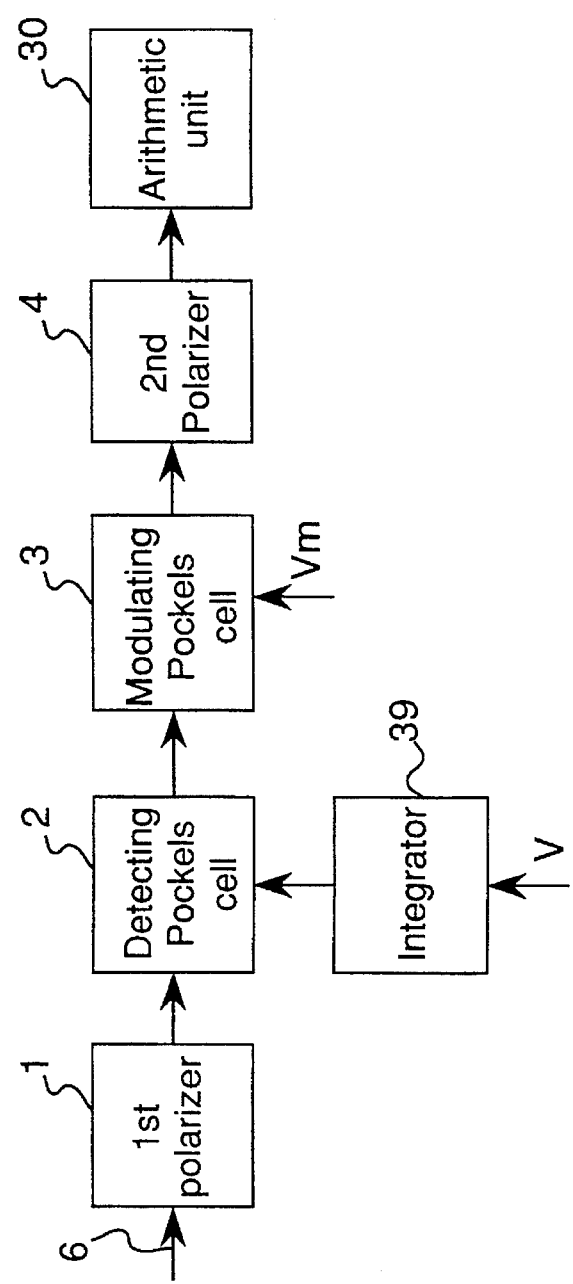
FIG. 6 is a diagram of an output-power frequency-modulated voltage sensor of a second embodiment in accordance with the present invention.
Figure 7:
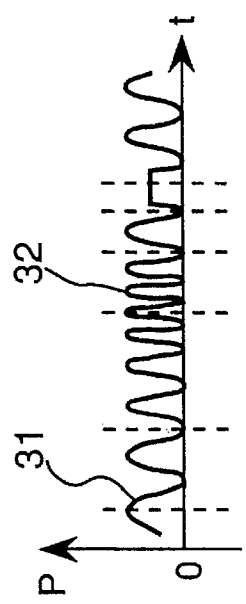
FIG. 7 is a waveform of the output P for showing a charge in the frequency thereof when a voltage to be detected is applied thereto.

Next, a second embodiment of the present invention is described with reference to FIGS. 6 and 7. As shown in FIG. 6, the second embodiment is the same as the first embodiment in that a first polarizer 1, a Pockels cell 2 for detection, a Pockels cell 3 for modulation, and a second polarizer 4 are arranged in this order along the optical axis of the voltage sensor. However, an integrator 14 that inputs a voltage V to be measured to itself and performs an integrating operation to output an electric field E for detection is inserted between Pockels cell 2 for detection and an input terminal for voltage V to be measured. Here, obtaining electric field E that varies by a change equivalent to the integral value of voltage V to be measured suffices. For example, the input to integrator 14 may be an electric field proportional to voltage V to be measured. With the application of voltage V to be measured, the output of polarizer 4 changes in the frequency from a sine wave 31 corresponding to the variation of the phase difference θ$_m$ of the Pockels cell 3 for modulation, which is proportional to periodic voltage V$_m$ for modulation, by an amount proportional to the phase difference θ of the Pockels cell 2 for detection, which is proportional to voltage V to be measured, as shown in FIG. 7. The result is a frequency-modulated waveform 32. Then signal analyzer 30 for optical calculation demodulates frequency-modulated waveform 32 to obtain voltage V to be measured proportional to the phase difference θ of the Pockels cell 2 for detection.

Thus, if a voltage is measured through a phase change or a frequency change in intensity modulated light, the measurement can be performed without being influenced by essential problems in dealing with an optical transmission channel such as a change in the loss of connection in an optical part or a change in light intensity due to the external environment. Further, since information other than that of the voltage to be measured is not mixed with the phase change or the frequency change, consideration of the distinction between the voltage to be measured and the other external influences in measuring a near DC voltage through an intensity change by a prior method becomes unnecessary, so that the measurement can be performed by a consistent method for voltages from DC to AC.

Figure 8:
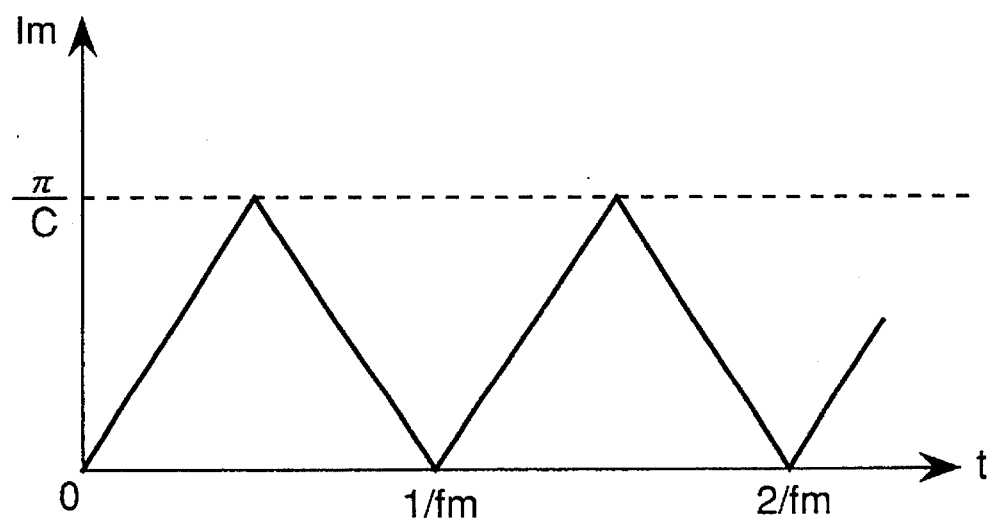
FIGS. 8 and 9 show examples of the waveform of a periodic voltage for modulation used in a voltage sensor of the present invention, respectively.

The above description is valid for any case where the directions of the first polarizer and the second polarizer are arbitrary. If the two directions are parallel or perpendicular to each other, then apart from a sawtooth waveform that varies the phase difference by 2 nπ radians, where n is a positive integer, during each period 10 as shown in FIG. 4, voltage V$_m$ for modulation that varies the phase difference by nπ from kπ to (k+n)π, where k is an integer, suffices, so that voltage V$_m$ for modulation can be made small. Further, as shown in FIG. 8, the waveform of voltage V$_m$ for modulation can be made isosceles triangular unlike the sawtooth waveform shown in FIG. 4, where the phase difference θ$_m$ is varied rapidly in a neighborhood of 2(k+n)π radians, so that the turbulence of the output wave occurs less. Here FIG. 8 shows the case of k=−1 and n=1.

Figure 9:
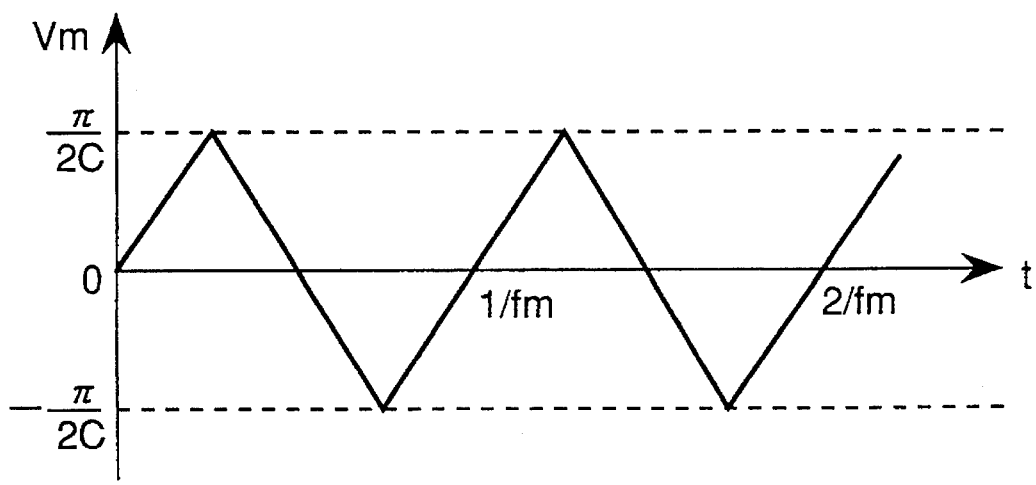
Figure 10:
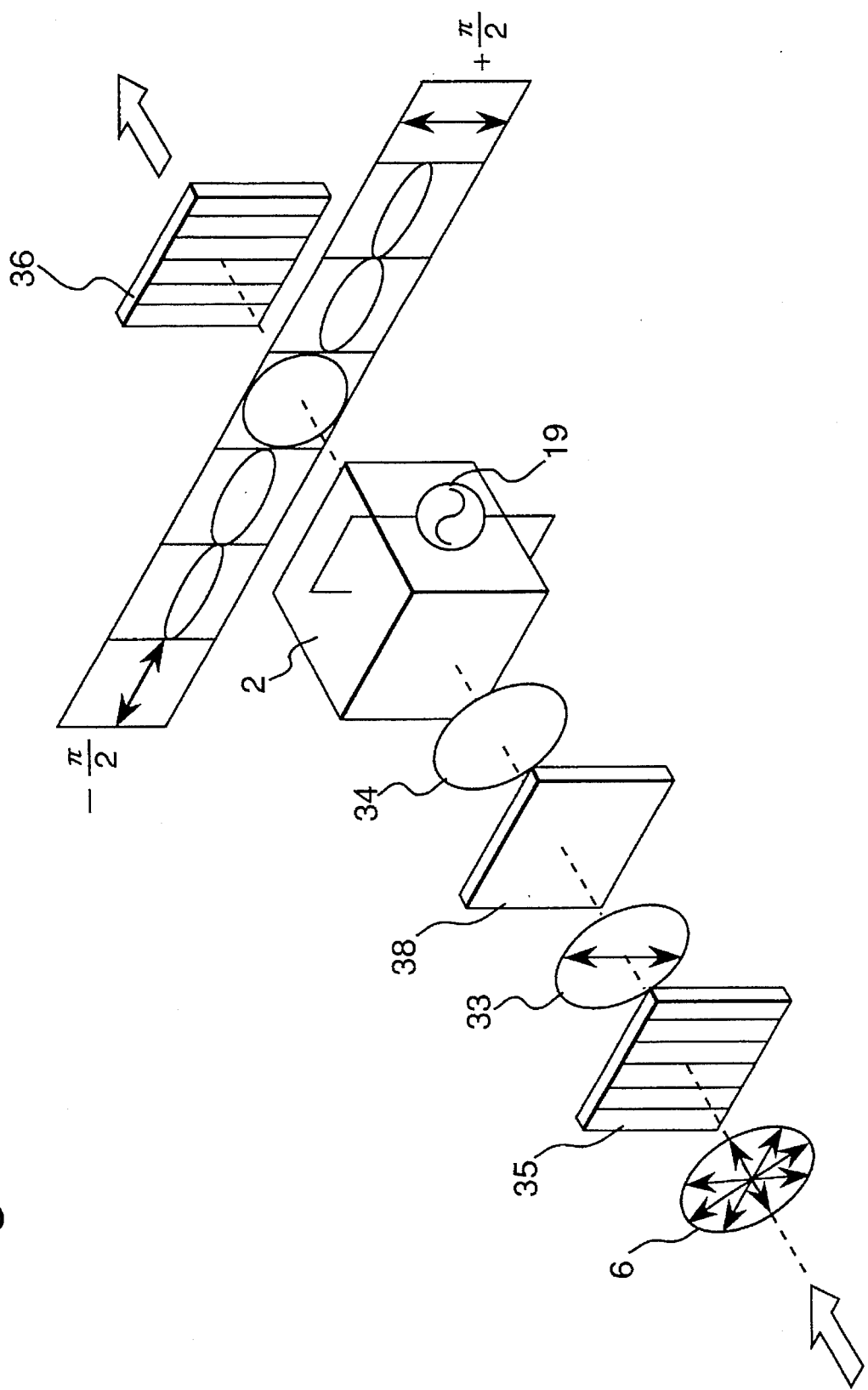
FIG. 10 is a diagram of a prior intensity-modulated voltage sensor used for measuring voltage.

Further, if the above two polarization directions are parallel or perpendicular to each other, and if a ¼ wavelength plate is installed between any neighboring devices of the first polarizer, the Pockels cell for detection, the Pockels cell for modulation, and the second polarizer to add an optical bias, then the phase difference θ$_m$ can be varied from kπ+π/2 to (k+n)π+π/2, where k is an integer and n is a positive integer, suffices. In particular, if k=−1 and n=1, then positive and negative voltages for modulation become symmetric as shown in FIG. 9, so that the load of the power source for the periodic voltage for modulation can be reduced.

Since both the first and second embodiments detect a voltage using a phase change or temporary phase change (frequency) in output power, the set angles of first polarizer 1 and second polarizer 4 can be arbitrary as long as they are inclined by 45 degrees from the major axis of the Pockels cells. Also, the first and second embodiments arranged Pockels cell 2 for detection and Pockels cell 3 for modulation from the incident side of light in this order. However, the order may be reversed.

Finally, if voltage V to be measured is located in the distance, or if all of first polarizer 1, Pockels cell 2 for detection, Pockels cell 3 for modulation, and second polarizer 4 can not be arranged in the same optical axis, such as when first polarizer 1 or Pockels cell 3 for modulation or second polarizer 4 is installed in another apparatus, then an optical transmission channel such as a polarization maintaining fiber where the polarization state is not changed can be used between neighboring devices of first polarizer 1, Pockels cell 2 for detection, Pockels cell 3 for modulation, and second polarizer 4 such that the distance between them is far or the optical axes differ.

As described above, the present invention has the effect of detecting a voltage to be measured from DC to high frequency without being influenced by the external environment.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A voltage sensor comprising
   a first polarizer for polarizing an incident light;
   a first Pockels cell disposed next to said first polarizer, said first Pockels cell receiving a voltage proportional to a voltage to be detected;
   a second Pockels cell disposed next to said first Pockels cell and having a set angle equal to that of said first Pockels cell, said second Pockels cell receiving a modulation voltage, said modulation voltage repeating a periodic and linear variation with a frequency higher than that of said voltage received by said first Pockels cell;
   a second polarizer disposed next to said second Pockels cell; and
   a signal analyzer disposed to receive an output light passing through said second polarizer, said analyzer detecting said voltage applied to said first Pockels cell based on a phase change in the intensity of said output light.

2. The voltage sensor according to claim 1, wherein said modulation voltage varies the phase difference between the voltages received by said first and second Pockels cells by $2n\pi$ radians during each period, wherein n is a positive integer.

3. The voltage sensor according to claim 1, wherein the polarization directions of said first polarizer and said second polarizer are set to be parallel to each other, and said modulation voltage varies the phase difference between the voltages received by said first and second Pockels cells from $k\pi$ to $(k+n)\pi$ during each period, where K is an integer and n is a positive integer.

4. The voltage sensor according to claim 1, wherein the polarization directions of said first polarizer and said second polarizer are set to be perpendicular to each other, and said modulation voltage varies the phase difference between the voltages received by said first and second Pockels cells from $k\pi$ to $(k+n)\pi$ during each period, where k is an integer and n is a positive integer.

5. The voltage sensor according to claim 1, wherein the polarization directions of said first polarizer and said second polarizer are set to be parallel, a one quarter wavelength plate is disposed between two adjacent devices selected from said first polarizer, said first Pockels cell, said second Pockels cell and second polarizer, the wavelength being that of the frequency of the voltage to be measured, and said modulation voltage varies the phase difference between the voltages received by said first and second Pockels cells from $k\pi+\pi/2$ to $(k+n)\pi+\pi/2$ for each period where k is an integer and n is a positive integer.

6. The voltage sensor according to claim 1, wherein an optical transmission channel for preserving the polarization of light passing therethrough is disposed at least between two adjacent devices selected from said first polarizer, said first Pockels cell, said second Pockels cell and said second polarizer.

7. A voltage sensor comprising
   a first polarizer for polarizing an incident light;
   a first Pockels cell disposed next to said first polarizer, said first Pockels cell receiving a modulation voltage;
   a second Pockels cell disposed next to said first Pockels cell and having a set angle equal to that of said first Pockels cell, said second Pockels cell receiving a voltage proportional to a voltage to be detected;
   said modulation voltage repeating a periodic and linear variation with a frequency higher than that of said voltage received by said second Pockels cell;
   a second polarizer disposed next to said second Pockels cell; and
   a signal analyzer disposed to receive an output light passing through said second polarizer, said analyzer detecting said voltage applied to said second Pockels cell based on a phase change in the intensity of said output light.

8. The voltage sensor according to claim 7, wherein said modulation voltage varies the phase difference between the voltages received by said first and second Pockels cells by $2n\pi$ radians during each period, where n is a positive integer.

9. The voltage sensor according to claim 7, wherein the polarization directions of said first polarizer and said second polarizer are set to be parallel to each other, and said modulation voltage varies the phase difference between the voltages received by said first and second Pockels cells from $k\pi$ to $(k+n)\pi$ during each period, where k is an integer and n is a positive integer.

10. The voltage sensor according to claim 7, wherein the polarization directions of said first polarizer and said second polarizer are set to be perpendicular to each other, and said modulation voltage varies the phase difference between the voltages received by said first and second Pockels cells from $k\pi$ to $(k+n)\pi$ during each period, where k is an integer and n is a positive integer.

11. The voltage sensor according to claims 7, wherein the polarization directions of said first polarizer and said second polarizer are set to be parallel, a one quarter wavelength plate is disposed between two adjacent devices selected from said first polarizer, said first Pockels cell, said second Pockels cell and said second polarizer, and said modulation voltage varies the phase difference between the voltages received by said first and second Pockels cells from $k\pi+\pi/2$ to $(k+n)\pi+\pi/2$ for each period where k is an integer and n is a positive integer.

12. The voltage sensor according to claim 7, wherein an optical transmission channel for preserving the polarization of light passing therethrough is disposed at least between two adjacent devices selected from said first polarizer, said first Pockels cell, said second Pockels cell and said second polarizer.

* * * * *